US009093972B2

United States Patent
Reber et al.

(10) Patent No.: US 9,093,972 B2
(45) Date of Patent: Jul. 28, 2015

(54) LIMITING CIRCUIT

(75) Inventors: Rolf Reber, Ulm (DE); Patrick Schuh, Elchingen (DE)

(73) Assignee: EADS Deutschland GmbH, Ottobrunn (DE)

( * ) Notice: Subject to any disclaimer, the term of this patent is extended or adjusted under 35 U.S.C. 154(b) by 47 days.

(21) Appl. No.: 13/514,632

(22) PCT Filed: Nov. 25, 2010

(86) PCT No.: PCT/DE2010/001387
§ 371 (c)(1),
(2), (4) Date: Jul. 12, 2012

(87) PCT Pub. No.: WO2011/069479
PCT Pub. Date: Jun. 16, 2011

(65) Prior Publication Data
US 2012/0281325 A1 Nov. 8, 2012

(30) Foreign Application Priority Data
Dec. 9, 2009 (DE) .......................... 10 2009 057 544

(51) Int. Cl.
*H03G 11/04* (2006.01)
*H03F 1/52* (2006.01)

(52) U.S. Cl.
CPC .............. *H03G 11/04* (2013.01); *H03F 1/523* (2013.01); *H03F 2200/211* (2013.01); *H03F 2200/441* (2013.01); *H03F 2200/66* (2013.01)

(58) Field of Classification Search
CPC ................................. H03F 1/523; H03G 11/04
USPC ...................................................... 361/58, 56
See application file for complete search history.

(56) References Cited

U.S. PATENT DOCUMENTS

| | | | |
|---|---|---|---|
| 4,037,168 A * | 7/1977 | Katoh et al. ................... 330/306 |
| 4,751,473 A * | 6/1988 | Ono ................................ 330/277 |
| 5,121,176 A * | 6/1992 | Quigg ............................ 257/340 |
| 5,157,289 A | 10/1992 | Vasile |
| 5,301,081 A | 4/1994 | Podell et al. |
| 5,629,648 A * | 5/1997 | Pratt .............................. 330/289 |
| 5,990,736 A * | 11/1999 | Nasuno et al. ................... 330/66 |
| 6,100,763 A * | 8/2000 | Durec et al. ................... 330/267 |
| 6,747,484 B1 | 6/2004 | Adlerstein et al. |
| 6,937,213 B2 * | 8/2005 | Iwasa et al. ...................... 345/60 |
| 7,154,339 B2 * | 12/2006 | Kramer et al. ................. 330/295 |
| 7,649,364 B2 * | 1/2010 | Cortigiani et al. ............ 324/601 |

(Continued)

FOREIGN PATENT DOCUMENTS

JP           10-247828           9/1998

OTHER PUBLICATIONS

International Search Report with English translation dated Mar. 31, 2011 (six (6) sheets).

(Continued)

*Primary Examiner* — Zeev V Kitov
(74) *Attorney, Agent, or Firm* — Crowell & Moring LLP

(57) ABSTRACT

A limiting circuit has a signal input and a signal output for limiting an output signal that is present at the signal output and that can be fed to a further circuit connected to the output of the limiting circuit. A voltage connection for feeding a bias voltage and a transistor are present, wherein the gate connection of the transistor is connected to the voltage connection by means of a first matching circuit and to the signal input by means of a second matching circuit.

11 Claims, 1 Drawing Sheet

(56) References Cited

U.S. PATENT DOCUMENTS

2002/0017960 A1* 2/2002 Jeong .................. 331/117 R
2008/0239601 A1 10/2008 Miyazawa et al.

OTHER PUBLICATIONS

Question of the Month Answers, Sep. 2007, Microwave Journal, Oct. 17, 2007 (three (3) sheets).

Scuderi et al., "A VSWR-protected silicon bipolar RF power amplifier with soft-slope power control", IEEE Journal of Solid-State Circuits, Mar. 2005, vol. 40, No. 3, pp. 611-621, XP 011128265 (eleven (11) sheets).

Coaker, "Radar Receiver Protection Technology", Military Microwaves 2007: Technical Feature, XP007917897 (two (2) sheets).

* cited by examiner

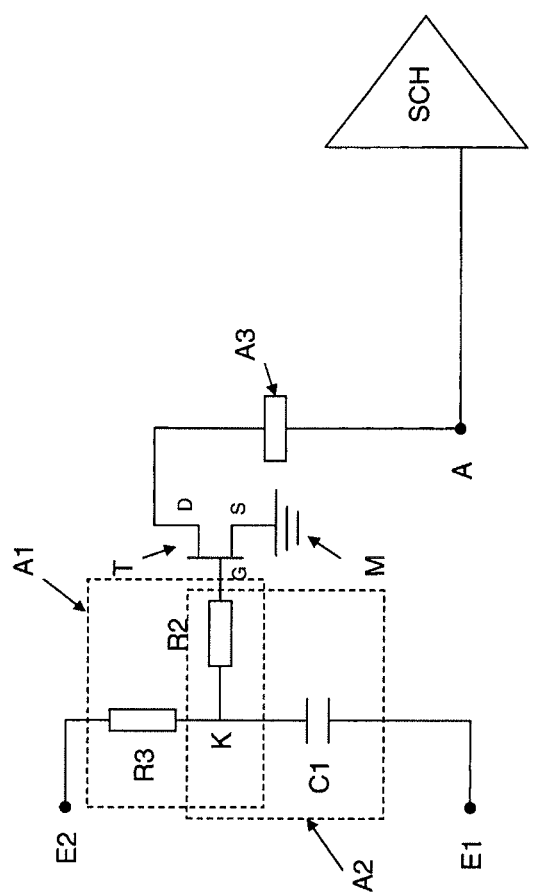

LIMITING CIRCUIT

BACKGROUND AND SUMMARY OF THE INVENTION

The Question of the Month Answers, September 2007, Microwave Journal, May 7, 2007, published Oct. 17, 2007 (which can be found at http://www.microwavejournal.com/articles/print/4771) describes a protection circuit for an assembly connected to the protection circuit. The protection circuit is designed using stripline or coaxial technology on a support having discrete elements. The support in turn is mounted in a suitable housing which also contains the connections for actuation and the high-frequency signals. The high-frequency output is connected to the input of the assembly to be protected via a high-frequency line.

A disadvantage of this arrangement is that the protection circuit is of discrete design or, if integrated, is implemented using diodes. Both approaches are cost intensive and unsuitable for applications in which there is only little space available. When diodes are used, the additional problem arises that the limiter diodes used do not have adequate properties to ensure a high capacity for the limiter circuit.

A further limiter circuit is known from U.S. Pat. No. 5,301,081. This circuit comprises a first circuit block having a transistor and a second circuit block having a diode arrangement. The transistor in the first circuit block is actuated by means of a complex detector circuit comprising a plurality of diodes. A disadvantage of this limiter circuit is the complicated design and the large number of components required.

Exemplary embodiments of the present invention are directed to a limiter circuit that eliminates the disadvantages of the prior art.

In the case of the limiter circuit according to the invention having a signal input and a signal output for limiting an output signal that is applied to the signal output and that can be supplied to a further circuit connected to the output of the limiter circuit, a connection for supplying a bias voltage and a transistor are present, wherein the gate connection of the transistor is connected to the connection via a first matching circuit and to the signal input via a second matching circuit.

By way of example, the matching circuits comprise resistors and/or inductances and/or capacitances and/or portions of line elements. This allows the operating point of the transistor to be adjusted according to the requirements. By way of example, it is thus possible to adjust the frequency response or the input matching of the transistor as appropriate.

BRIEF DESCRIPTION OF THE DRAWING FIGURE

The invention is explained in more detail with reference to a FIGURE. The single FIGURE shows a schematic design for a limiter circuit according to the invention.

DETAILED DESCRIPTION

The signal input E1 of the limiter circuit is connected to the gate connection of a transistor T via a capacitor C1 and a resistor R2. The connection E2 is connected to the gate connection of the transistor T via a resistor R3 and the resistor R2. The capacitor C1 and the resistor R3 are connected to one another at the point K. The connection E2 can have a voltage source (not shown) connected to it. The voltage from the voltage source can be used to adjust the operating point of the transistor T as appropriate.

The combination of R3 and R2 in this case symbolizes the first matching circuit A1, and the combination of R2 and C1 symbolizes the second matching circuit A2.

The source connection S of the transistor T is connected to ground M, and the drain connection D is connected to the output A of the limiter circuit. The output A of the limiter circuit A can have a further circuit SCH to be protected connected to it, expediently via a third matching circuit A3.

Expediently, the transistor T and the further circuit are in the form of assemblies using semiconductor technology for power applications (e.g., gallium nitride). It is furthermore possible for the limiter circuit to be integrated in the circuit SCH to be protected.

In the case of small input signals (lower than 10 mW; corresponding to normal operation of the limiter circuit), the gate voltage on the transistor T does not change. This means that the transistor T remains off. In the case of large signals (higher than 10 mW), the rectification effect in the transistor T produces an opposing voltage which turns on said transistor and hence channels off a portion of the input signal at the input E1 to ground M and hence brings about limiting (protection effect). The resistor R2 is used as protection against an excessive gate current on the transistor T and thus prevents the latter itself from being destroyed. A voltage source at the connection point E2 is used to adjust the operating point of the transistor such that no limiting occurs during normal operation of the limiter circuit.

Furthermore, it can also be used to adjust the response threshold for limiting.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

The invention claimed is:

1. A limiter circuit, comprising:
    a signal input coupled to a connection point via a capacitor;
    a signal output that provides a output signal to a further circuit connected to the signal output;
    a voltage connection configured to supply a bias voltage, wherein the voltage connection is coupled to the connection point via a first resistor;
    a transistor; and
    a second resistor connected between the connection point and a gate connection of the transistor, wherein the first and second resistors form a first matching circuit and the capacitor and the second resistor form a second matching circuit,
    wherein the voltage connection is connected only to a gate of the transistor and not to a source of the transistor.

2. The limiter circuit as claimed in claim 1, further comprising:
    a third matching circuit configured between a drain connection of the transistor and the further circuit.

3. The limiter circuit as claimed in claim 1, wherein the transistor and assemblies of the further circuit are fabricated using semiconductor technology for power applications.

4. The limiter circuit as claimed in claim 2, wherein the transistor and assemblies of the further circuit are fabricated using semiconductor technology for power applications.

5. The limiter circuit as claimed in claim 1, wherein a drain of the transistor is connected to the signal output.

6. The limiter circuit as claimed in claim 1, wherein the bias voltage is an adjustable bias voltage.

7. The limiter circuit as claimed in claim 1, wherein the transistor is connected to the voltage connection and the connection point of the limiter circuit in such a manner a portion of a gate current of the transistor is channeled to ground via the source of the transistor when an amount of power at the gate of the transistor is above a threshold.

8. The limiter circuit as claimed in claim 7, wherein the voltage connection is coupled to the transistor in the limiter circuit in such a manner that the threshold is set by the bias voltage.

9. The limiter circuit as claimed in claim 1, wherein the transistor is configured within the limiter circuit in such a manner that the transistor limits an amount of voltage of the output signal that is provided to the signal output via a drain of the transistor.

10. The limiter circuit as claimed in claim 1, wherein the transistor further includes a drain, and the transistor is connected to the signal output via the drain of the transistor and not by the source or gate of the transistor.

11. The limiter circuit as claimed in claim 1, wherein the source of the transistor is connected to ground.

\* \* \* \* \*